United States Patent
Hung et al.

(10) Patent No.: US 10,109,467 B2
(45) Date of Patent: Oct. 23, 2018

(54) ADVANCED EXHAUST SYSTEM

(71) Applicant: Taiwan Semiconductor Manufacturing Co., Ltd., Hsin-Chu (TW)

(72) Inventors: Shih-Wei Hung, Kaohsiung (TW); Chia-Chiung Lo, Taipei (TW); Chien-Feng Lin, Zhudong Township (TW); Tsung-Hsun Yu, Hsin Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/170,143

(22) Filed: Jun. 1, 2016

(65) Prior Publication Data

US 2017/0352524 A1    Dec. 7, 2017

(51) Int. Cl.
| | |
|---|---|
| *C23C 16/44* | (2006.01) |
| *H01J 37/32* | (2006.01) |
| *H01L 21/67* | (2006.01) |
| *H01L 21/3065* | (2006.01) |

(52) U.S. Cl.
CPC .. *H01J 37/32853* (2013.01); *H01J 37/32357* (2013.01); *H01J 37/32449* (2013.01); *H01J 37/32834* (2013.01); *H01L 21/3065* (2013.01); *H01L 21/67069* (2013.01)

(58) Field of Classification Search
CPC ... A61L 9/13–9/22; A61L 9/131–9/135; A61L 9/122–9/127; B01D 53/9459

USPC .................................................. 156/345.29
See application file for complete search history.

(56) References Cited

U.S. PATENT DOCUMENTS

| | | | |
|---|---|---|---|
| 5,137,701 A * | 8/1992 | Mundt | B01D 53/00 204/157.3 |
| 6,696,662 B2 * | 2/2004 | Jewett | H01J 37/32009 118/723 MW |
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |

(Continued)

*Primary Examiner* — Rudy Zervigon
(74) *Attorney, Agent, or Firm* — Haynes and Boone, LLP

(57) ABSTRACT

An apparatus for a semiconductor process includes an exhaust pipe coupled to a reaction chamber and a pump; a pressure control valve that is coupled to the exhaust pipe and configured to control a pressure value in the reaction chamber; a first pipe that is coupled to the exhaust pipe and etching gas source such that the first pipe is configured to provide an etching gas into the exhaust pipe; a second pipe that is coupled to the exhaust pipe and a radical generator such that the second pipe is configured to provide a radical into the exhaust pipe; and a third pipe that is coupled to the exhaust pipe and a diluted gas source such that the third pipe is configured to provide diluted gas into the exhaust pipe.

20 Claims, 4 Drawing Sheets

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 2014/0001574 A1 | 1/2014 | Chen et al. |
| 2014/0110755 A1 | 4/2014 | Colinge |
| 2014/0151812 A1 | 6/2014 | Liaw |

* cited by examiner

ADVANCED EXHAUST SYSTEM

BACKGROUND

In a conventional epitaxial growth system, reaction gases are supplied to a reaction chamber, and a semiconductor wafer is heated to thermally decompose the supplied gases, thereby growing a thin film having a predetermined composition on the wafer. Products and non-reacted gases which are not used for growing the thin film on the wafer are exhausted from the reaction chamber through an exhaust pipe. In general, such an exhaust pipe is coupled with a pressure control valve that is configured to control a pressure value inside the reaction chamber. Typically, it is not uncommon to see that the unreacted/excessive gases from the chamber may form a solid phase by-product along the pipe and/or over the pressure control valve. Thus, a need to avoid such by-products being formed in an exhaust system, especially over the pressure control valve, is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
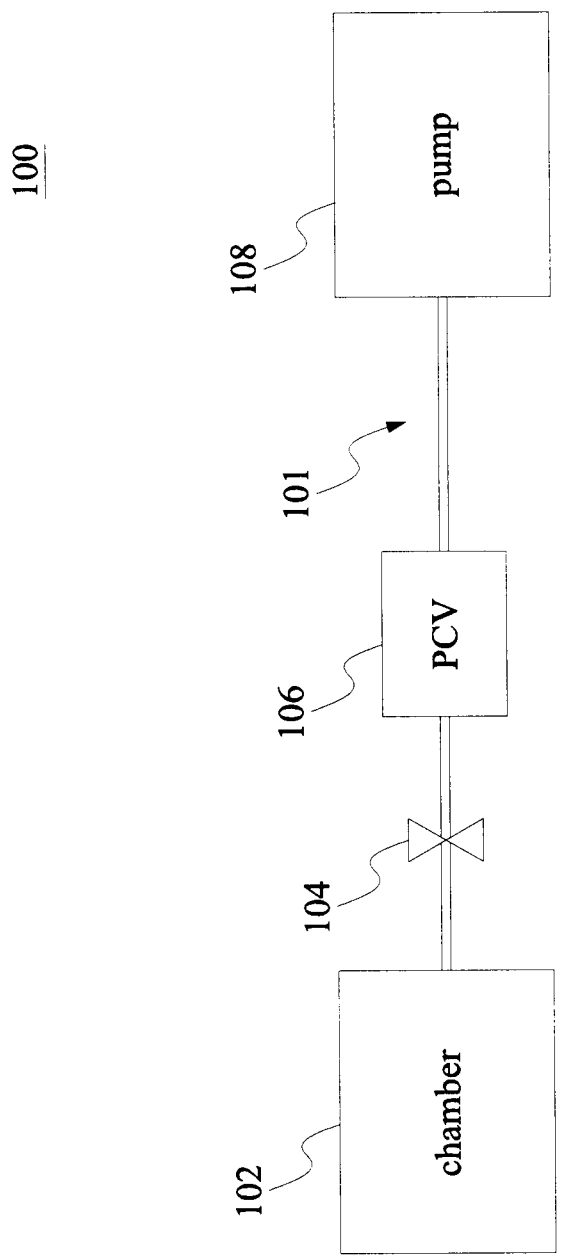
FIG. 1 is a schematic view of an exhaust system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is an illustrated embodiment of a system 100 for exhausting a reacted gas from a reaction system. As illustrated, the system 100 includes a reaction chamber 102, a control valve 104, a pressure control valve 106, an exhaust pipe 101, and a pump 108. Generally, the reactive chamber 102 may be a chamber that is used for a chemical reaction such as, for example, a doping of a film/a semiconductor structure, an epitaxial growth of a film, a (metal-organic) chemical vapor deposition growth of a film/a semiconductor structure, etc., and thus one or more reactive gases (e.g., silane, germane, phosphine, arsine, etc.) may be directed into the chamber for such a chemical reaction. The exhaust pipe 101 is configured to connect the chamber 102 to a pump 108 such that an unreacted reactive gas is drawn away, by the pump 108 through the pipe 101, from the chamber 102 and thus a pressure value inside the chamber 102 may be maintained. Further, along the pipe 101, the control valve 104 (e.g., a flow control valve) is used to control an exhaust flow of the pipe 101 and the pressure control valve 106 is used to provide a more precise controllability on the pressure value inside the chamber 102. As such, the pressure value inside the chamber 102 may be well maintained at a desired value so as to provide a more stable chemical reaction inside the chamber 102.

In general, the pressure control valve 106 includes at least one valve, and the pressure value inside the chamber 102 is controlled by that valve through one of a variety of approaches such as a mechanical approach (e.g., a spring), an electrical approach (e.g., a coupled information handling system), or a hybrid of chemical and electrical approach to control an "openability" of the valve (e.g., the wider the valve is open, the more air flows through the valve). For a typical chemical reaction inside the chamber 102, a thermal decomposition of the reactive gas occurs at an elevated temperature and any of unreacted or excessive reactive gas may be exhausted from the chamber 102 through the pipe 101 to the pump 108. Accordingly, it is not uncommon to see that the unreacted/excessive gases from the chamber may form a solid phase by-product along the pipe 101, over the valve 104, and/or over the pressure control valve 106. This may be due to a lower temperature at a distal end (from the chamber 102) of the pipe 101. Such a solid-phase by-product may particularly cause a disadvantageous effect on the pressure control valve 106 and/or component(s) in the pressure control valve 106, for example, the pressure control valve 106 losing the controllability on the chamber pressure. Thus, a need to avoid such by-products being formed in an exhaust system, especially over the pressure control valve, is desired.

Figure 2:
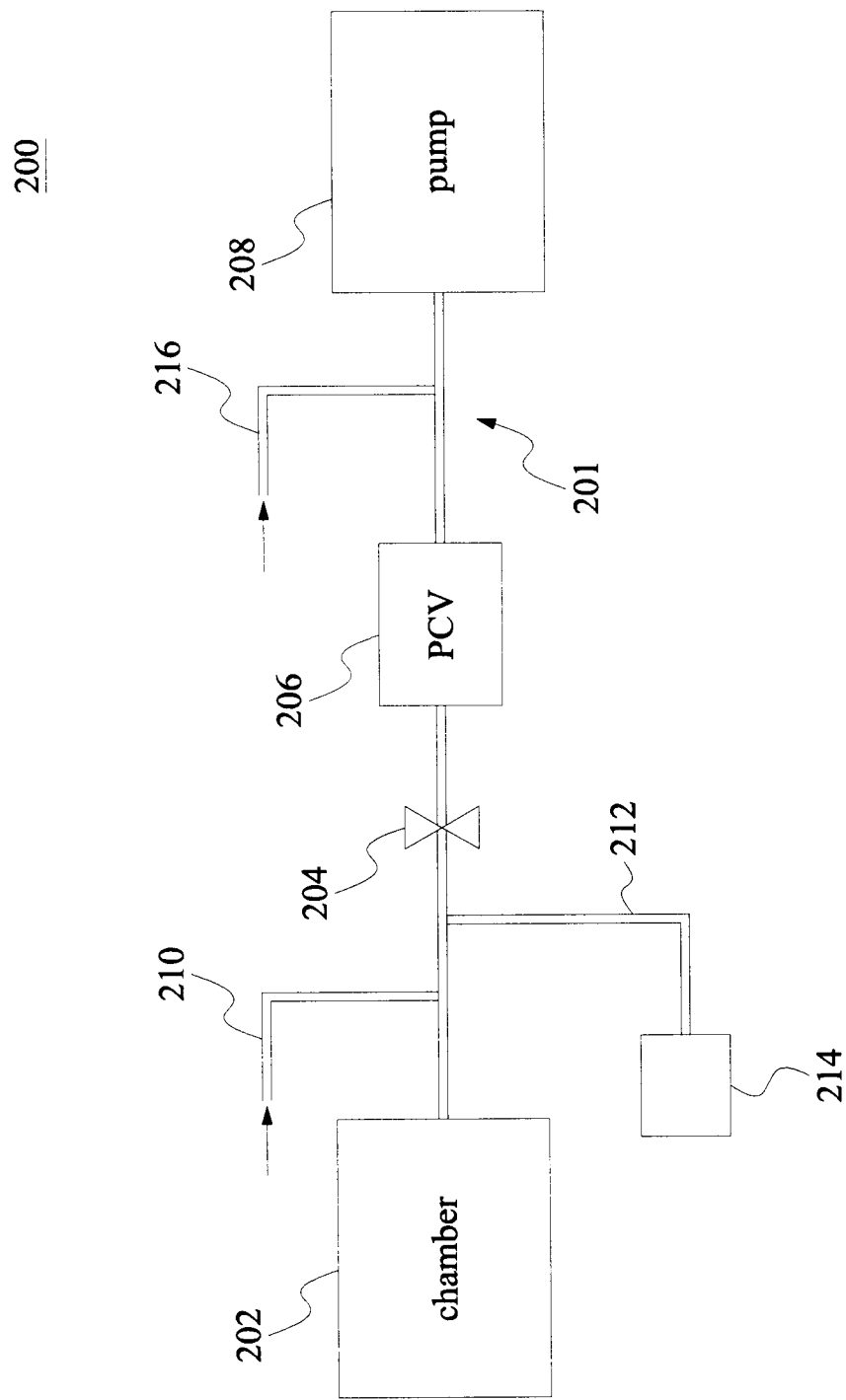
FIG. 2 is a schematic view of an exhaust system, in accordance with some embodiments.

The present disclosure provides various embodiments of systems and methods to avoid the above-mentioned by-product(s) in an exhaust system. FIG. 2 is a schematic view of an embodiment of a novel exhaust system 200 that is designed to address the above-mentioned issues. The system 200 in FIG. 2 is merely an illustrated example and thus any of a variety of components (e.g., a filter, a nitrogen tank, etc.) may be added/included/coupled into the system 200 while remaining within the scope of the present disclosure.

Referring now to FIG. 2, the system 200 includes a reaction chamber 202, an exhaust pipe 201, a pump 208, a control valve 204, a pressure control valve 206, a first pipe 210 coupled to the exhaust pipe 201, a second pipe 212 coupled to the exhaust pipe 201, and a third pipe 216 coupled to the exhaust pipe 201. Further, the second pipe 212 is coupled to a remote plasma source 214 that is configured to generate free radical(s) which will be discussed in the following description. Generally, the reactive chamber 202 may be a chamber that is used for a chemical reaction such as, for example, a doping of a film/a semiconductor structure, an epitaxial growth of a film, a (metal-organic) chemical vapor deposition growth of a film/a semiconductor structure, etc., and thus one or more reactive gases (e.g., silane, germane, phosphine, arsine, etc.) may be directed into the chamber for such a chemical reaction. And the control valve 204 and the pressure control valve 206 coupled to the exhaust pipe 201 may be configured to control an exhaust flow of the pipe 201 and to control/maintain a pressure value within the chamber 202 respectively.

Referring still to FIG. 2, the first pipe 210 may be configured to direct an etching gas into the exhaust pipe 201. The etching gas is configured to react and further etch the above-mentioned by-product(s). In accordance with various illustrative embodiments, the etching gas may include hydrogen chloride, chlorine, ammonia, and/or nitrogen trifluoride. More specifically, such an etching gas may be directed by the first pipe 210 into the exhaust pipe 201 using the following conditions: temperature ranging between about room temperature to about 700° C., a pressure ranging between about 5 mTorr and about 760 Torr, and a flow rate of etching gas ranging between about 10 standard liters per minute to about 45 standard liters per minute.

The second pipe 212 may be configured to direct radical(s) generated by the coupled remote plasma source 214 into the exhaust pipe 201. Such radicals are configured to react and further etch the above-mentioned by-product(s). In some embodiments, the remote plasma source 214 may use tetrafluoromethane, ammonia, nitrogen trifluoride, hydrogen, and/or argon to generate the radicals for etching the solid-phase by-products. In the embodiment of using tetrafluoromethane, free radicals of fluorine may be generated by the remote plasma source 214 and may be directed, by the second pipe 212, to perform the etching. More specifically, such free radicals may be generated by the remote plasma source 214 using the following conditions: a radio-frequency plasma power ranging between about 0.4 kW and about 7 kW, and a pressure ranging between about 0.1 Torr and about 10 Torr.

The third pipe 216 may be configured to direct a diluted gas into the pipe 201. The diluted gas is configured to lower an amount of the etching gas (e.g., concentration of the etching gas) within the pipe 201. As such, an excessive amount of the etching gas provided by the pipe 210 may be diluted by the diluted gas and may be further pumped away by the pump 208 so that an undesired damage, caused by the etching gas, on the pipe is advantageously avoided. In accordance with various illustrative embodiments, the diluted gas may include nitrogen and/or hydrogen. More specifically, such a diluted gas may be directed by the third pipe 216 using the following conditions: temperature ranging between about room temperature to about 100° C., a pressure ranging between about 5 mTorr and about 760 Torr, and a flow rate of the diluted gas ranging between about 10 standard liters per minute to about 45 standard liters per minute.

Alternatively or additionally, in some embodiments, the configuration of the first pipe 210, the second pipe 212, and the third pipe 216 may be changed. In the illustrated embodiment of FIG. 2, the first pipe 210 and the second pipe 212 are at one side against the pressure control valve 206 and the third pipe 216 is at another side against the pressure control valve 206, and more specifically in FIG. 2, the first pipe 210 is configured to be relatively closer to the chamber 202 than the second pipe 212. However, in some alternative embodiments, the third pipe 216 may be configured to be at a same side as the first pipe 210 and the second pipe 212. For example, the third pipe 216 is configured to be positioned between the chamber 202 and the pressure control valve 206.

Figure 3:
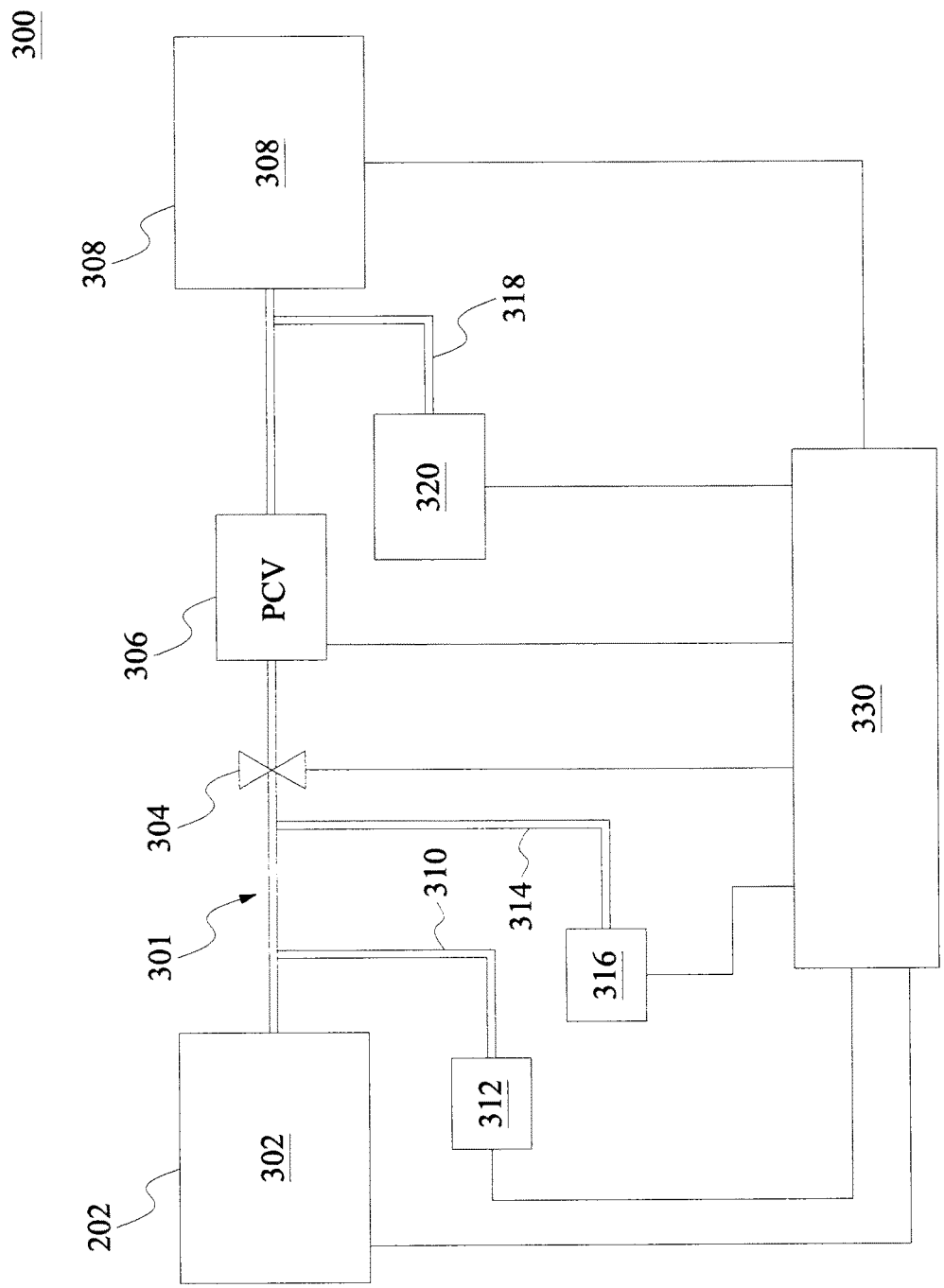
FIG. 3 is a schematic view of an exhaust system, in accordance with some embodiments.

FIG. 3 provides another embodiment of a novel exhaust system 300 that is designed to address the above-mentioned issues. The system 300 in FIG. 3 is merely an illustrated example and thus any of a variety of components (e.g., a filter, a nitrogen tank, etc.) may be added/included/coupled into the system 300 while remaining within the scope of the present disclosure.

Referring now to FIG. 3, the system 300 includes a reaction chamber 302, an exhaust pipe 301, a pump 308, a control valve 304, a pressure control valve 306 connected in series along the exhaust pipe 301, a first pipe 310 coupled to the exhaust pipe 301 and to an etching gas source 312, a second pipe 314 coupled to the exhaust pipe 301 and to a remote plasma source 316, a third pipe 318 coupled to the exhaust pipe 301 and to a diluted gas source 320, and a main controller 330. Further in the illustrated embodiment of FIG. 3, the main controller 330 is coupled to the reaction chamber 302, the control valve 304, the pressure control valve 306, the pump 308, the etching gas source 312, the remote plasma source 316, and the diluted gas source 320. In some embodiments, the main controller 330 may be an information handling system such as, for example, a desktop computer, a laptop, a smart phone, a tablet, or any of a variety of information handling systems.

Referring still to FIG. 3, in general, the reaction chamber 302 may be a chamber that is used for a chemical reaction such as, for example, a doping of a film/a semiconductor structure, an epitaxial growth of a film, a (metal-organic) chemical vapor deposition growth of a film/a semiconductor structure, etc., and thus one or more reactive gases (e.g., silane, germane, phosphine, arsine, etc.) may be directed into the chamber for such a chemical reaction. The control valve 304 coupled to the exhaust pipe 301 may be configured to control an exhaust flow of the pipe 201 and the pressure control valve 306 coupled to the exhaust pipe 301 may be configured to control/maintain a pressure value within the chamber 302. In some embodiments, the first pipe 310 may be configured to direct an etching gas, provide by the etching gas source 312, into the exhaust pipe 301. The etching gas is configured to react and further etch the above-mentioned by-product(s) such as a solid-phase layer formed of gas that is not reacted in the reaction chamber 302. In accordance with various illustrative embodiments, the etching gas may include hydrogen chloride, chlorine, ammonia, and/or nitrogen trifluoride. More specifically, the main controller 330 may use the following conditions: temperature ranging between about room temperature to about 700° C., a pressure ranging between about 5 mTorr and about 760 Torr, and a flow rate of etching gas ranging between about 10 standard liters per minute to about 45 standard liters per minute to direct the etching gas through the first pipe 310 into the exhaust pipe 301.

The second pipe 314 may be configured to direct radical(s) generated by the coupled remote plasma source 316 into the exhaust pipe 301. Such radicals are configured to react and further etch the above-mentioned solid-phase layer. In some embodiments, the remote plasma source 316 may use tetrafluoromethane, ammonia, nitrogen trifluoride, hydrogen, and/or argon to generate the radicals for etching the solid-phase layer. In the embodiment of using tetrafluoromethane, free radicals of fluorine may be generated by the remote plasma source 316 and may be directed, by the second pipe 314 into the exhaust pipe 301, to perform the etching (of the solid-phase layer). More specifically, such free radicals may be generated by the remote plasma source 316 and the main controller 330 may use the following conditions: a radio-frequency plasma power ranging between about 0.4 kW and about 7 kW, and a pressure ranging between about 0.1 Torr and about 10 Torr to direct generate the free radicals and further cause the second pipe 314 to direct the generated radicals into the exhaust pipe 301.

The third pipe 318 may be configured to direct a diluted gas, provided by the diluted gas source 320, into the pipe 301. In some embodiments, the diluted gas is configured to lower an amount of the etching gas (e.g., concentration of the etching gas) within the pipe 301. As such, an excessive amount of the etching gas in the pipe 301 may be diluted by the diluted gas and may be further pumped away by the pump 308 so that an undesired damage, caused by the etching gas, on the pipe 301 may be advantageously avoided. In accordance with various illustrative embodiments, the diluted gas may include nitrogen and/or hydrogen. More specifically, such a diluted gas may be directed by the third pipe 318 to the exhaust pipe 301 using the following conditions: temperature ranging between about room temperature to about 100° C., a pressure ranging between about 5 mTorr and about 760 Torr, and a flow rate of the diluted gas ranging between about 10 standard liters per minute to about 45 standard liters per minute. In some embodiments, the conditions identified above may be provided or configured by the main controller 330.

In some specific embodiments, the main controller 330 may be used/maintained by a user of the system 300. Moreover, the user may have an access to control the system directly and/or over a network. In general, the main controller 330 includes a storage device that is configured to store a plurality of recipes. Each of the recipes may be configured or provided by the user/administrator and further includes at least one of: a reaction sequence, a setting of a temperature value, a setting of a pressure value, ON/OFF the valve 304, flow rates of the etching gas and the diluted gas, a setting of a power value of the remote plasma source 316, etc.

Alternatively or additionally, in some embodiments, the configuration of the first pipe 310, the second pipe 314, and the third pipe 318 may be changed. In the illustrated embodiment of FIG. 3, the first pipe 310 and the second pipe 314 are at one side against the pressure control valve 306 and the third pipe 318 is at another side against the pressure control valve 306, and more specifically in FIG. 3, the first pipe 310 is configured to be relatively closer to the chamber 302 than the second pipe 314. However, in some alternative embodiments, the third pipe 318 may be configured to be at a same side as the first pipe 310 and the second pipe 314. For example, the third pipe 318 is configured to be positioned between the chamber 302 and the pressure control valve 306. Further, yet in some alternative embodiments, the first pipe 310 and the second pipe 314 are at one side against the pressure control valve 306 and the third pipe 318 is at another side against the pressure control valve 306, and more specifically, the second pipe 314 is configured to be relatively closer to the chamber 302 than the first pipe 310.

Figure 4:
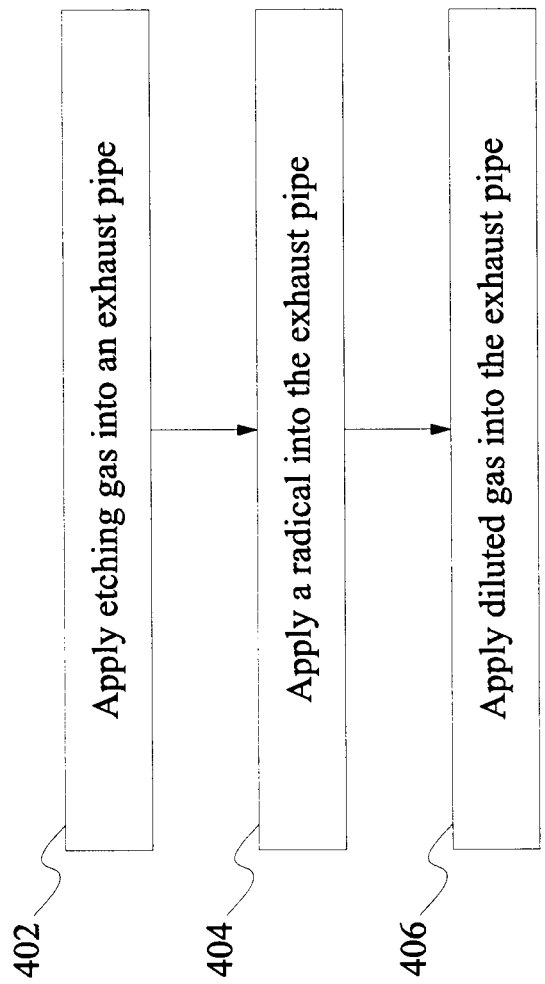
FIG. 4 is a flowchart of a method constructed in accordance with some embodiments.

FIG. 4 shows a flowchart of a method 400 to remove a by-product in an exhaust system in accordance with various embodiments. Additional steps can be provided before, during, and after the method 400, and some of the steps described can be replaced, eliminated, or moved around for additional embodiments of the method 400.

The method 400 begins at step 402 with applying etching gas into an exhaust pipe to etch a solid-phase layer. In conjunction with FIG. 3, the etching gas may be provided by the etching gas source 312 and the etching gas may be directed by the pipe 310 into the exhaust pipe 301. In some embodiments, the solid-phase layer may be formed, at least in part, of gas that is not reacted in the chamber 302, and such solid-phase layer may be formed anywhere in the system 300 such as, for example, the exhaust pipe 301, the valve 304, the pressure control valve 306, and/or the pump 308. Referring back to FIG. 4 and still in association with FIG. 3, the method 400 continues to step 404 with applying a radical into the exhaust pipe. The radical may be provided by the remote plasma source 316 and the radical may be directed by the pipe 314 into the exhaust pipe 301 to etch the solid-phase layer. In some embodiments, the method 400 continues to step 406 with applying diluted gas into the exhaust pipe. The diluted gas may be provided by the diluted gas source 320 and may be directed to the exhaust pipe 301 through the pipe 318. In some embodiments, the diluted gas is configured to reduce an amount of the etching gas so as to prevent damage on the exhaust pipe 301 (caused by the etching gas).

In some examples, the pressure control valve 306 is controlled by motor. The motor may be controlled by a control system. The control system may utilize an electronic feedback system to turn the pressure control valve 306 on and off. The control system may also control the remote plasma source 316 and the reactive gas 312 as well. In one example, the control system can be configured to allow the reactive gas and the remote plasma source to be turned on when the pressure control valve 306 is open. Additionally, the control system can be configured to turn off the reactive gas and the remote plasma source when the pressure control valve 306 is closed. In some examples, however, the remote plasma source may remain on while the pressure control valve is open while the reactive gas is off.

The embodiments of the disclosed systems and methods provide various advantages over the conventional systems to exhaust gas in an exhaust system. Conventionally, an exhaust pipe couples a pump to a reaction chamber. Any excessive or unreacted gas in the reaction chamber is exhausted by the pump through the exhaust pipe. In general, a pressure control valve is connected to the pipe in series so as to control a pressure value inside the chamber. Such a pressure control valve plays an important role in various aspects such as, for example, determining whether a desired reaction condition inside the chamber (e.g., a pressure value) is met. However, the unreacted gas may form a by-product (in solid phase) over the pressure control valve and thus causes the pressure control valve to malfunction, which may in turn disadvantageously arise issues to a reaction inside the reaction chamber. In contrast, the disclosed embodiments may circumvent these issues. For example, by coupling at least two pipes to an exhaust pipe so as to provide etching gas and radicals into the exhaust pipe, the above-identified by-product may be etched by the etching gas/radicals. After the by-product is etched by the etching gas/radicals, the by-product may be reacted into gaseous phase product which may be exhaust by the pump. As such, any formed or to-be formed by-product may be advantageously eliminated. Moreover, based on a protective ground, an additional pipe coupled to the exhaust pipe that is configured to direct diluted gas into the exhaust pipe may dilute an excessive amount of the etching gas. Thereafter, damage on the component(s) of the exhaust system (e.g., the pressure control valve, the exhaust pipe, etc.) due to the etching gas may be advantageously avoided.

In an embodiment, an apparatus for a semiconductor process includes an exhaust pipe coupled to a reaction chamber and a pump; a pressure control valve that is coupled to the exhaust pipe and configured to control a pressure value in the reaction chamber; a first pipe that is coupled to the exhaust pipe and etching gas source such that the first pipe is configured to provide an etching gas into the exhaust pipe; a second pipe that is coupled to the exhaust pipe and a radical generator such that the second pipe is configured to provide a radical into the exhaust pipe; and a third pipe that is coupled to the exhaust pipe and a diluted gas source such that the third pipe is configured to provide diluted gas into the exhaust pipe.

In another embodiment, an apparatus for a semiconductor process includes an exhaust pipe coupled to a reaction chamber and a pump, a pressure control valve that is, in series, connected to the exhaust pipe and that is configured to control a pressure value in the reaction chamber, an etching gas source coupled to the exhaust pipe via a first pipe, the etching gas source providing an etching gas into the exhaust pipe via the first pipe, a radical generator source coupled to the exhaust pipe via a second pipe, the radical generator source providing a radical into the exhaust pipe via the second pipe, and a diluted gas source coupled to the exhaust pipe via a third pipe, the diluted gas source providing a diluted gas into the exhaust pipe.

Yet in another embodiment, a method includes applying, through a first pipe coupled to an exhaust pipe, etching gas into the exhaust pipe to etch a layer that is formed, at least in part, of gas that is not reacted in a chamber coupled to the exhaust pipe, applying, through a second pipe coupled to the exhaust pipe, a radical into the exhaust pipe to etch the layer, applying, through a third pipe coupled to the exhaust pipe, diluted gas into the exhaust pipe to reduce an amount of the etching gas in the exhaust pipe.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus for a semiconductor process, comprising:
an exhaust pipe coupled to carry exhaust from a reaction chamber to a pump;
a pressure control valve that is coupled to the exhaust pipe and configured to control a pressure value in the reaction chamber;
a first pipe that is coupled to the exhaust pipe and an etching gas source such that the first pipe is configured to provide an etching gas from the etching gas source into the exhaust in the exhaust pipe upstream from the pressure control valve;
a second pipe that is coupled to the exhaust pipe and a radical generator such that the second pipe is configured to provide a radical from the radical generator into the exhaust in the exhaust pipe upstream from the pressure control valve; and
a third pipe that is coupled to the exhaust pipe and a diluted gas source such that the third pipe is configured to provide diluted gas into the exhaust in the exhaust pipe, the third pipe being coupled to the exhaust pipe downstream from the first pipe.

2. The apparatus of claim 1, wherein the radical generator is a plasma source.

3. The apparatus of claim 1, wherein the etching gas includes a material selected from the group consisting of hydrogen chloride, chlorine, ammonia, and nitrogen trifluoride.

4. The apparatus of claim 1, wherein the radical is based on a gaseous source that is selected from the group consisting of tetrafluoromethane, ammonia, nitrogen trifluoride, hydrogen, and argon.

5. The apparatus of claim 1, wherein the diluted gas includes material selected from the group consisting of nitrogen and hydrogen.

6. The apparatus of claim 1, wherein the etching gas provided by the first pipe is configured to etch a layer that is formed over the pressure control valve.

7. The apparatus of claim 1, wherein the radical provided by the second pipe is configured to etch a layer that is formed over the pressure control valve.

8. The apparatus of claim 1, wherein the diluted gas provided by the third pipe is configured to diminish an amount of the etching gas in the exhaust pipe.

9. The apparatus of claim 1, wherein the etching gas is exhausted to the pump through the exhaust pipe.

10. An apparatus for a semiconductor process, comprising:
an exhaust pipe coupled to carry exhaust from a reaction chamber to a pump;
a pressure control valve that is, in series, connected to the exhaust pipe and that is configured to control a pressure value in the reaction chamber;
an etching gas source coupled to the exhaust pipe via a first pipe, the etching gas source providing an etching gas into the exhaust pipe via the first pipe such that the etching gas is introduced into the exhaust prior to the pressure control valve;
a radical generator source coupled to the exhaust pipe via a second pipe, the radical generator source providing a radical into the exhaust pipe via the second pipe such that the radical is introduced into the exhaust prior to the pressure control valve; and
a diluted gas source coupled to the exhaust pipe via a third pipe, the diluted gas source providing a diluted gas into the exhaust pipe, the third pipe being coupled to the exhaust pipe downstream from the second pipe.

11. The apparatus of claim 10, further comprising a controller that is coupled to the pressure control valve, the etching gas source, the radical generator source, and the diluted gas source.

12. The apparatus of claim 10, wherein the radical generator source includes a remote plasma source.

13. The apparatus of claim 12, wherein the radical is based on a gaseous source that is selected from the group consisting of tetrafluoromethane, ammonia, nitrogen trifluoride, hydrogen, and argon.

14. The apparatus of claim 10, wherein the etching gas includes a material selected from the group consisting of hydrogen chloride, chlorine, ammonia, and nitrogen trifluoride.

15. The apparatus of claim 10, wherein the diluted gas includes material selected from the group consisting of nitrogen and hydrogen.

16. The apparatus of claim 10, wherein the diluted gas provided by the third pipe is configured to diminish an amount of the etching gas in the exhaust pipe.

17. An apparatus for a semiconductor process, comprising:
   a reaction chamber;
   a pump;
   an exhaust pipe that couples the reaction chamber to the pump;
   a pressure control valve that is coupled to the exhaust pipe and configured to control a pressure value in the reaction chamber;
   a first pipe that is coupled to the exhaust pipe and an etching gas source such that the first pipe is configured to provide an etching gas into the exhaust pipe upstream from the pressure control valve; and
   a second pipe that is coupled to the exhaust pipe and a radical generator such that the second pipe is configured to provide a radical into the exhaust pipe upstream from the pressure control valve, the second pipe being coupled to the exhaust pipe downstream from the first pipe.

18. The apparatus of claim 17, further comprising a third pipe that is coupled to the exhaust pipe and a diluted gas source such that the third pipe is configured to provide diluted gas into the exhaust pipe.

19. The apparatus of claim 17 further comprising a control valve disposed along the exhaust pipe downstream from the first pipe and the second pipe and upstream from the pressure control valve.

20. The apparatus of claim 17 further comprising a controller to activate a device from a group consisting of the etching gas source and the radical generator based on a state of the pressure control valve.

* * * * *